(12) United States Patent
Lin et al.

(10) Patent No.: US 12,142,534 B2
(45) Date of Patent: Nov. 12, 2024

(54) REPLACEMENT CONTACT PROCESS

(71) Applicant: Applied Materials, Inc., Santa Clara, CA (US)

(72) Inventors: Sankuei Lin, Cupertino, CA (US); Ajay Bhatnagar, Mountain View, CA (US); Nitin Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/194,825

(22) Filed: Mar. 8, 2021

(65) Prior Publication Data

US 2021/0217668 A1 Jul. 15, 2021

Related U.S. Application Data

(62) Division of application No. 15/918,613, filed on Mar. 12, 2018, now Pat. No. 10,943,834.

(Continued)

(51) Int. Cl.
*H01L 27/092* (2006.01)
*H01L 21/02* (2006.01)
(Continued)

(52) U.S. Cl.
CPC ......... *H01L 21/823871* (2013.01); *H01L 21/02603* (2013.01); *H01L 21/76805* (2013.01); *H01L 21/76831* (2013.01); *H01L 21/76895* (2013.01); *H01L 21/76897* (2013.01); *H01L 21/823807* (2013.01); *H01L 21/823814* (2013.01); *H01L 27/092* (2013.01); *H01L 29/0673* (2013.01); *H01L 29/0847* (2013.01);
(Continued)

(58) Field of Classification Search
CPC ............ H01L 29/0673; H01L 29/0847; H01L 29/78618; H01L 29/823814; H01L 27/092; H01L 29/42392; H01L 29/78696
See application file for complete search history.

(56) References Cited

U.S. PATENT DOCUMENTS 9,583,399 B1   2/2017  Chen et al.
2015/0279840 A1* 10/2015  Huang ............. H01L 29/66545
                                                           438/283

(Continued)

OTHER PUBLICATIONS https://www.dictionary.com/browse/sawtooth.*

*Primary Examiner* — Omar F Mojaddedi
(74) *Attorney, Agent, or Firm* — Kilpatrick Townsend & Stockton LLP (57) ABSTRACT

Processing methods may be performed to expose a contact region on a semiconductor substrate. The methods may include selectively removing a first region of a silicon material between source/drain regions of a semiconductor substrate to expose a first region of oxide material. The methods may include forming a liner over the first region of oxide material and contacting second regions of the silicon material proximate the source/drain regions of the semiconductor substrate. The methods may also include selectively removing the second regions of the silicon material proximate the source/drain regions of the semiconductor substrate to expose a second region of the oxide material. The methods may further include selectively removing the second region of the oxide material from a surface of a contact in the semiconductor structure.

20 Claims, 10 Drawing Sheets

Related U.S. Application Data (60) Provisional application No. 62/470,707, filed on Mar. 13, 2017.

(51) Int. Cl.
  *H01L 21/768* (2006.01)
  *H01L 21/8238* (2006.01)
  *H01L 29/06* (2006.01)
  *H01L 29/08* (2006.01)
  *H01L 29/417* (2006.01)
  *H01L 29/423* (2006.01)
  *H01L 29/786* (2006.01)

(52) U.S. Cl.
  CPC .. *H01L 29/41733* (2013.01); *H01L 29/42392* (2013.01); *H01L 29/78618* (2013.01); *H01L 29/78696* (2013.01)

(56) References Cited

U.S. PATENT DOCUMENTS

| | | |
|---|---|---|
| 2017/0104061 A1 | 4/2017 | Peng et al. |
| 2017/0317205 A1* | 11/2017 | Lee ................. H01L 29/785 |
| 2018/0151683 A1* | 5/2018 | Yeo ................. H01L 29/0847 |
| 2018/0166327 A1* | 6/2018 | Hsiao ............... H01L 29/41791 |

* cited by examiner

REPLACEMENT CONTACT PROCESS

CROSS REFERENCES TO RELATED APPLICATIONS

The present application is a divisional of U.S. Non-Provisional application Ser. No. 15/918,613, filed Mar. 12, 2018, which claims priority to U.S. Provisional Application No. 62/470,707, filed Mar. 13, 2017. The contents of each application is hereby incorporated by reference in their entirety for all purposes.

TECHNICAL FIELD

The present technology relates to semiconductor systems, processes, and equipment. More specifically, the present technology relates to systems and methods for forming and etching material layers on a semiconductor device.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process or individual material removal. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etch processes may penetrate into intricate features and trenches, but may not provide acceptable top-to-bottom profiles. As device sizes continue to shrink in next-generation devices, selectivity may play a larger role when only a few nanometers of material are formed in a particular layer, especially when the material is critical in the transistor formation. Many different etch process selectivities have been developed between various materials, although standard selectivities may no longer be suitable at current and future device scale.

Thus, there is a need for improved systems and methods that can be used to produce high quality devices and structures. These and other needs are addressed by the present technology.

SUMMARY

Processing methods may be performed to expose a contact region on a semiconductor substrate. The methods may include selectively removing a first region of a silicon material between source/drain regions of a semiconductor substrate to expose a first region of oxide material. The methods may include forming a liner over the first region of oxide material and contacting second regions of the silicon material proximate the source/drain regions of the semiconductor substrate. The methods may also include selectively removing the second regions of the silicon material proximate the source/drain regions of the semiconductor substrate to expose a second region of the oxide material. The methods may further include selectively removing the second region of the oxide material from a surface of a contact in the semiconductor structure.

In embodiments, each of the selective removal operations may be performed using a plasma process including a halogen-containing precursor. Each contact may include a silicon-containing material, and in embodiments, each contact may include multiple sections characterized by a sawtooth or triangular vertical profile. For example, the multiple sections may include at least three sections. Selectively removing the second region of the oxide material may include removing the oxide material from each surface characterized by the sawtooth or triangular vertical profile. Selectively removing the second region of the oxide material may substantially maintain the first region of the oxide material. In some embodiments, the method does not utilize a reactive-ion etch operation and does not utilize a wet etch operation. In embodiments, the liner may include silicon nitride. A top portion of the contact may be etched vertically less than one nanometer during the selectively removing the second region of the oxide material of the present technology.

The present technology also includes semiconductor structures. The structures may include two contact regions proximate a gate and separated by an interior region proximate the gate. A metal material may be formed about contacts in the two contact regions. The interior region may include a liner material. Additionally, the interior region may include an oxide layer between the liner material and the gate. In some embodiments, one of the two contact regions may include a p-contact material, and the other of the two contact regions may include an n-contact material. The contacts may be characterized by a vertical profile having a first exterior thickness and a second exterior thickness less than the first exterior thickness. The region characterized by the second exterior thickness may be located below a region characterized by the first exterior thickness. In embodiments, the structure may include two contacts including a silicon-containing material. For example, a first contact of the contacts may be or include SiGe, and a second contact of the contacts may be or include SiP.

The present technology also includes methods of forming a semiconductor structure. The methods may include removing a silicon-containing material from a contact region of a semiconductor substrate to expose an etch stop layer. The contact region of the semiconductor substrate may be proximate a second region of the substrate, and the second region of the substrate may include the etch stop layer and a liner layer overlying the etch stop layer. The method may also include removing the etch stop layer from the contact region of the semiconductor substrate while substantially maintaining the etch stop layer and the liner layer in the second region of the substrate.

In some embodiments, the method may also include forming a metal-containing layer in the contact region of the semiconductor substrate. The liner layer may be located along the etch stop layer and along a depth of the metal-containing layer. The contact region may include a contact material formed in a diamond pattern characterized by a plurality of vertically disposed diamond-shaped sections in some embodiments. The metal-containing layer may be proximate each exterior surface of the plurality of vertically disposed diamond-shaped sections.

Such technology may provide numerous benefits over conventional systems and techniques. For example, the greater contact exposure may allow improved metallization providing wrap-around contacts having multiple sections. Additionally, the improved selectivity with an oxide etch stop layer may maintain additional contact material compared to conventional processes. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems and components for semiconductor processing of small pitch features. In traditional self-aligned contact etch processes, a silicon nitride contact etch stop layer may be used to protect the contact silicon-based material, such as silicon germanium or silicon phosphide, or other contact materials. Because a cap layer and spacers may also be formed of silicon nitride, the etching process to remove this etch stop layer may not provide enough selectivity relative to other critical features. During various opening processes, the multiple critical dimension sizes may cause a loading effect to etch beyond budget availability of material. For example, traditional processes may include a mask layer followed by a reactive-ion etch ("RIE") process that allows opening of the structure for a gap fill layer. Despite being a relatively anisotropic process, the RIE etch may still have selectivity causing sidewall losses. Although budgeting for this loss may be considered during formation, such as with over-formation of material, because regions within the structure being etched have different dimensions, calculating for the amount of loss in one area may not be suitable for the amount of loss in a larger area. Accordingly, although 5 nm of loss may occur in one section that is budgeted, loss in a larger section of 6-7 nm may still occur, causing mismatches during fabrication.

Additionally, RIE processes produce an etch byproduct or polymer residue that is generally removed with a wet etching process. This wet etch often over-etches sidewall protection layers beyond critical dimensions, which can cause problems with formation and spacing of adjacent transistor layers, and further etches low-k nitride spacers and inter-layer dielectric oxide. Moreover, the removal of the silicon nitride contact etch stop layer is often performed with an anisotropic etch that can further reduce the silicon-nitride cap and spacer materials, and may only be performed to the level of the contact, and no further, as it may additional etch the contacts. Because the selectivity of such a nitride removal may be in the range of 10:1, the critical contact materials may be overly etched near the top of the contact structure if the etch process is performed below a top surface.

The present technology overcomes these issues with several adjustments to the material layers formed, as well as adjustments to the process for removal and formation. By utilizing an oxide contact etch stop layer alternatively to a nitride etch stop layer, selective etch processes performed in particular equipment may be utilized to etch at higher selectivity than with nitride layers, which may allow additional patterning operations that may not previously have been capable. Additionally, by adjusting the patterning process, critical dimension loss can be limited or removed from sidewalls and other features to produce improved contact features, such as a wrap-around contact that may include multiple nodes not previously possible.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes alone. The disclosure will discuss one possible system and chamber that can be used with the present technology to perform certain of the removal operations before describing operations of an exemplary process sequence according to the present technology.

Figure 1:
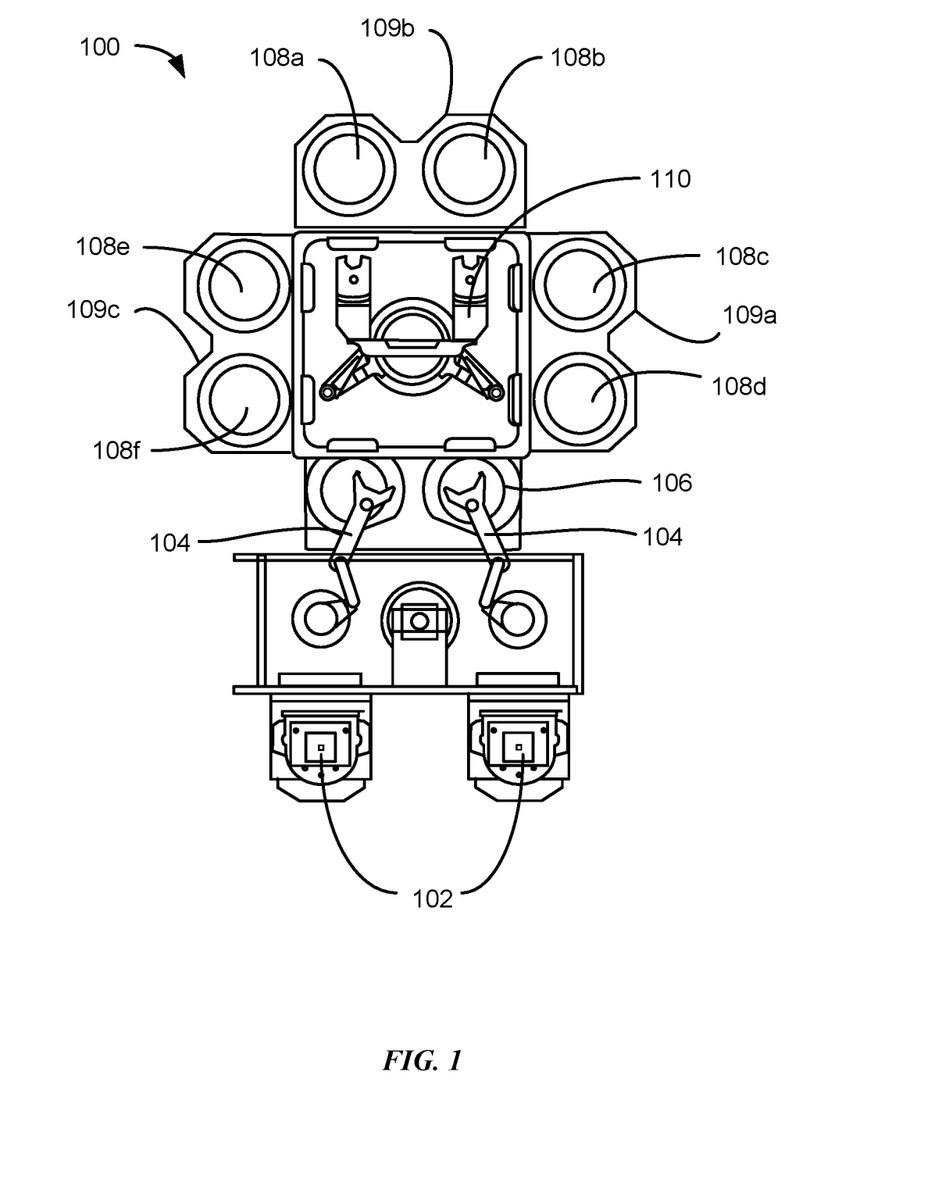
FIG. 1 shows a top plan view of an exemplary processing system according to embodiments of the present technology.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
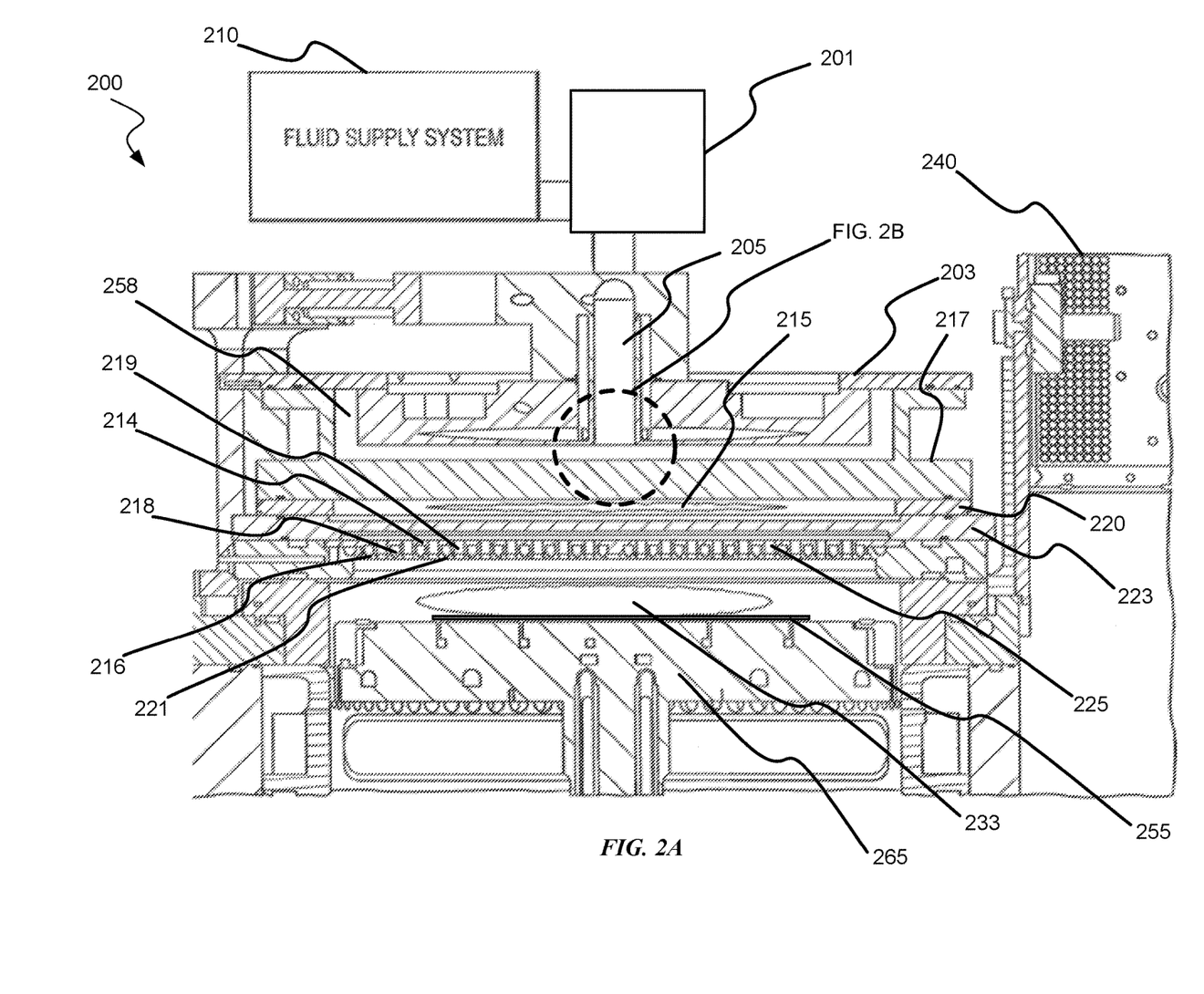
FIG. 2A shows a schematic cross-sectional view of an exemplary processing chamber according to embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a substrate support 265, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may comprise aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. In embodiments, the plasma formed in substrate processing region 233 may be a DC biased plasma formed with the pedestal acting as an electrode. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
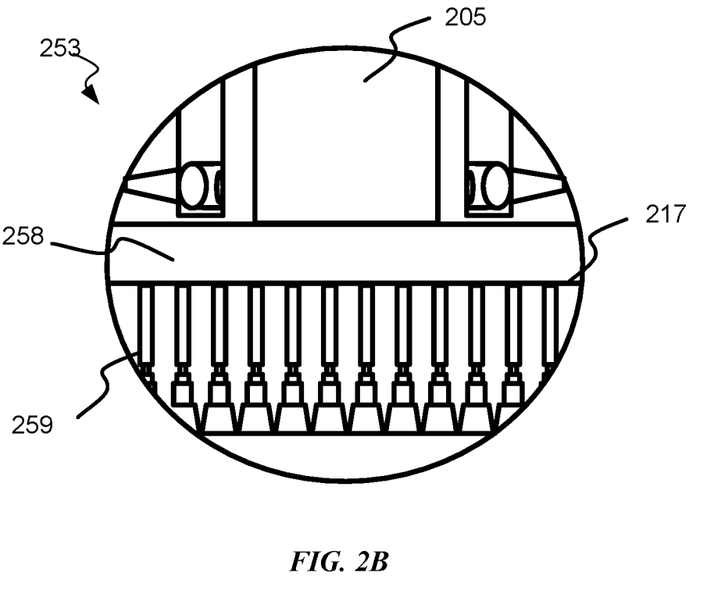
FIG. 2B shows a detailed view of an exemplary showerhead according to embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
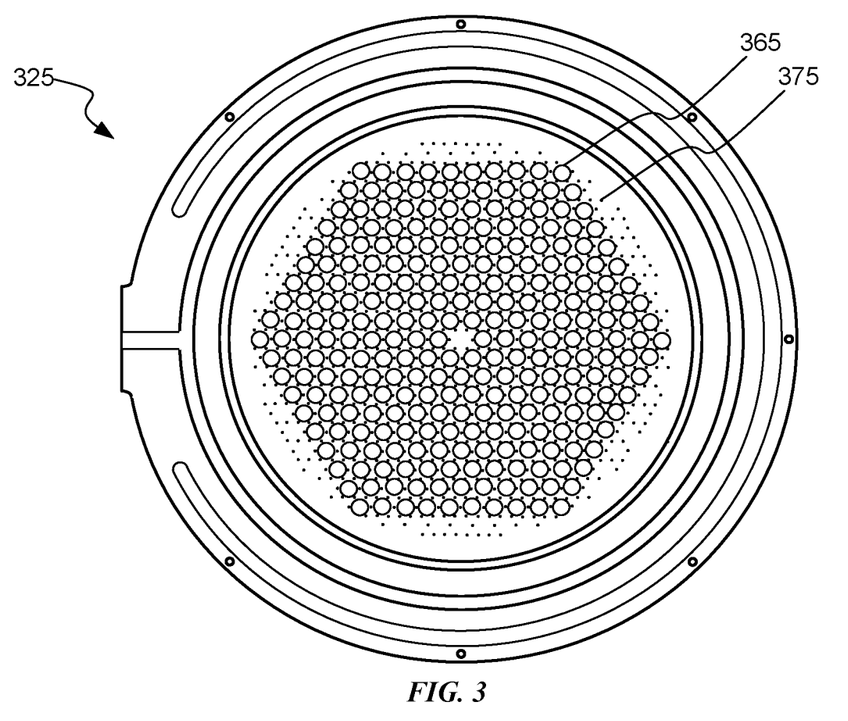
FIG. 3 shows a bottom plan view of an exemplary showerhead according to embodiments of the present technology.

The gas distribution assemblies such as showerhead 225 for use in the processing chamber section 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the gas distribution assembly 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
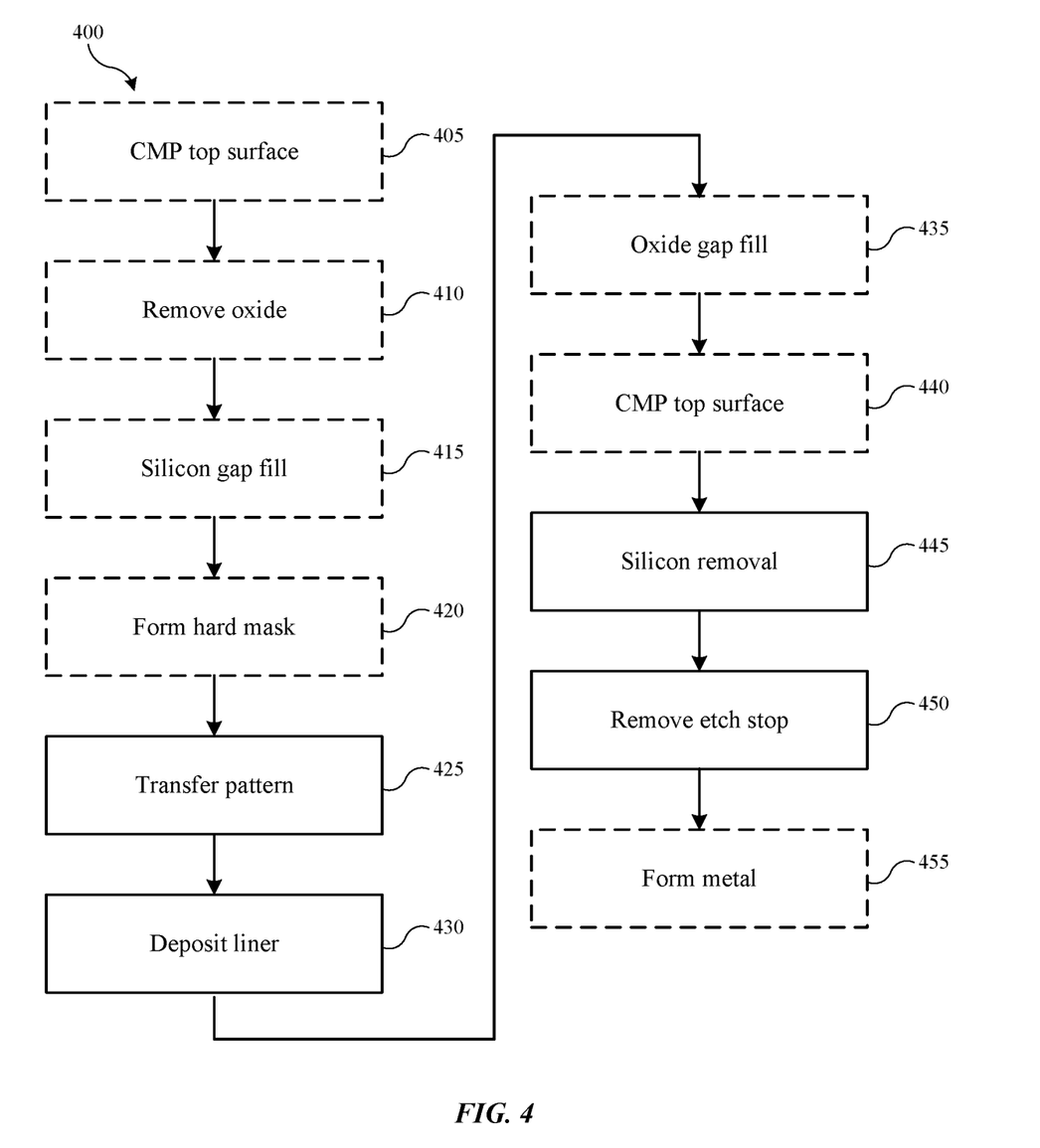
FIG. 4 shows selected operations in a method of forming a semiconductor structure according to embodiments of the present technology.

FIG. 4 illustrates an etching method 400, many operations of which may be performed, for example, in the chamber 200 as previously described. Method 400 may include one or more operations prior to the initiation of the method, including front end processing, deposition, etching, polishing, cleaning, or any other operations that may be performed prior to the described operations. The method may include a number of optional operations as denoted in the figure, which may or may not be specifically associated with the method according to the present technology. For example, many of the operations are described in order to provide a broader scope of the structural formation, but are not critical to the technology, or may be performed by alternative methodology as will be discussed further below. Method 400 describes the operations shown schematically in FIG. 5, the illustrations of which will be described in conjunction with the operations of method 400. It is to be understood that FIG. 5 illustrates only partial schematic views, and a substrate may contain any number of transistor sections having aspects as illustrated in the figures.

Figure 5A:
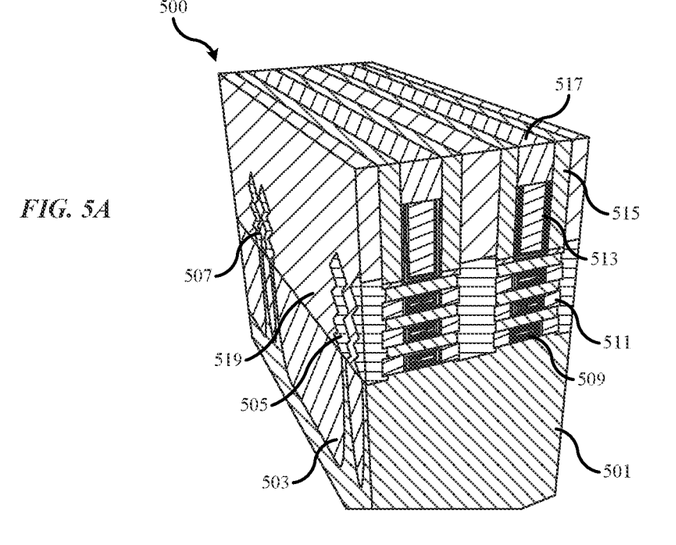
FIGS. 5A-5K illustrate schematic perspective views of substrate materials on which selected operations are being performed according to embodiments of the present technology.

Method 400 may involve optional operations to develop the semiconductor structure to a particular fabrication operation. As illustrated in FIG. 5A, the semiconductor structure may represent a device after chemical-mechanical polishing operation 405 has been performed, or some other removal operation to form a planar or substantially planar top surface of semiconductor structure 500. As illustrated, structure 500 may include a substrate 501 made of or containing silicon or some other semiconductor substrate material, within which an oxide material 503 or other material for filling trenches has been formed within the substrate 501. Structure 500 may have a number of transistor structures formed overlaying the substrate 501.

The transistor structures may include source/drain regions of the substrate including contact materials 505, 507, which may be similar or different materials in embodiments. For example, contact material 505 may include an n-contact material for an N-MOS operating region, which may be a silicon-containing material, such as, for example, silicon phosphide (SiP), or may be any other material that may operate in an n-region of the substrate. Similarly, contact material 507 may include a p-contact material for a P-MOS operating region, which may be a silicon-containing material, such as, for example, silicon germanium (SiGe), or may be any other material that may operate in a p-region of the substrate. The transistor structure may include any number of designs currently used in semiconductors, being developed, or future designs that may utilize aspects of the present technology described further below. An exemplary transistor structure illustrated includes nanowires 509. Nanowires 509 may be any material suitable for transistors, and one exemplary structure may include silicon nanowires. Nanowires 509 may be contained by spacers 511, which may reside on either side of nanowires 509. In embodiments the spacers 511 may be silicon nitride, although it is to be understood that other materials including nitrides, oxides, or other materials may be used. Exemplary structure 500 includes 3 nanowires as illustrated, although structures according to the present technology may include fewer or a greater number of nanowires in embodiments.

The structure may include gate 513 formed over the substrate 501 and nanowires 509. Gate 513 may include a metal, such as tungsten, cobalt, or any other suitable metal or material for a gate function, and may include a dummy material, such as silicon, depending on the stage of fabrication when the structure has been formed. Gate 513 may be contained within spacers 515, which may be a low-k spacer including a variety of dielectric materials. An exemplary material may be silicon nitride in embodiments. A cap material 517 may also be formed over the gate to contain it within a dielectric material. The cap material 517 may be any dielectric material, and may also be a type of silicon nitride in embodiments. Structure 500 may also have an interlayer dielectric 519, which may have been formed or deposited about structure 500. Chemical mechanical polishing, such as in operation 405, may have been performed to expose the cap material 517 and spacers 515 as illustrated in FIG. 5A.

Figure 5B:
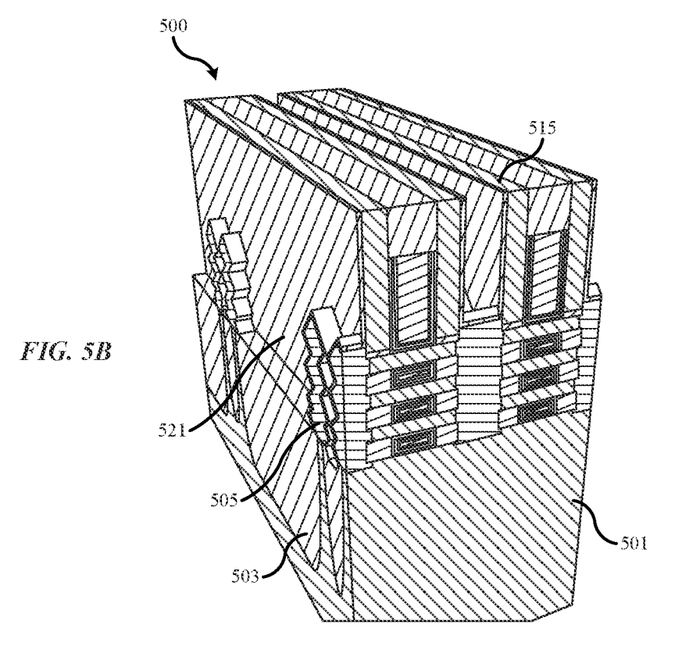

At operation 410, interlayer dielectric material 519 may be selectively removed from the semiconductor structure 500. Removal of interlayer dielectric material 519 may expose contact etch stop layer 521, as illustrated in FIG. 5B. In embodiments of the present technology, contact etch stop layer 521 may be an oxide material, although other materials may be used in other embodiments. Contact etch stop layer 521 may reside over many structures having critical dimensions, and may also operate as spacers for subsequent transistor layers. Contact etch stop layer 521 may cover regions of contact materials 505, 507, and may line spacers 515. As illustrated, contact etch stop layer 521 lines the entire exposed surface of the sidewall spacers 515 down to oxide material 503 within substrate 501.

The removal operation 410 may be performed in chamber 200 previously described, which may allow an oxide selective etch to be performed, which may remove interlayer dielectric material 519, which may be lower-quality oxide material such as a flowable oxide material, from contact etch stop layer 521, which may be a higher-quality oxide material such as an atomic-layer deposition oxide, for example. The process may be performed using a dry etch process utilizing a plasma or remote plasma, which may produce plasma effluents of a halogen-containing precursor, such as, for example, a fluorine-containing precursor, or a chlorine-containing precursor. The process may also utilize a hydrogen-containing precursor in embodiments, which may also be included in the remote plasma or may bypass the remote plasma to interact with radical halogen-containing plasma effluents in the processing region.

The process may be performed below about 10 Torr in embodiments, and may be performed below or about 5 Torr in embodiments. The process may also be performed at a temperature below about 100° C. in embodiments, and may be performed below about 50° C. As performed in chamber 200, or a variation on this chamber, or in a different chamber capable of performing similar operations, the process may remove interlayer dielectric material 519 selective to contact etch stop layer 521, spacer material 515, and cap material 517. In embodiments, the process may have a selectivity towards interlayer dielectric material 519 with respect to contact etch stop layer 521, spacer material 515, and cap material 517 greater than or about 100:1, and may have a selectivity greater than or about 200:1, greater than or about 300:1, greater than or about 400:1, or greater than or about 500:1 in embodiments.

Figure 5C:
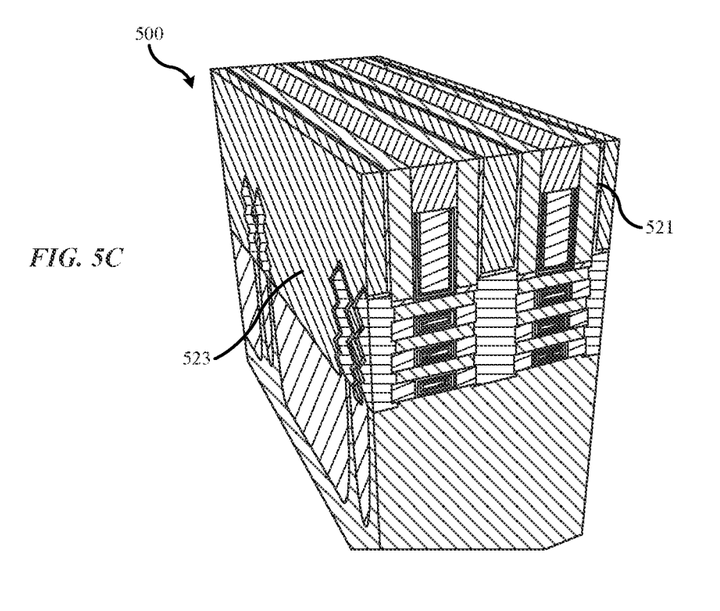

Once interlayer dielectric material 519 has been removed, a gap fill may be performed in operation 415. As illustrated in FIG. 5C, gap fill material 523 may be formed or deposited over the contact etch stop layer 521, and within contact materials 505, 507, as well as between the gates 513. The gap fill material 523 may be a silicon-containing material, and may be amorphous silicon in embodiments. The gap fill material 523 may be deposited by any number of mechanisms including in a flowable chemical vapor deposition process, for example.

Figure 5D:
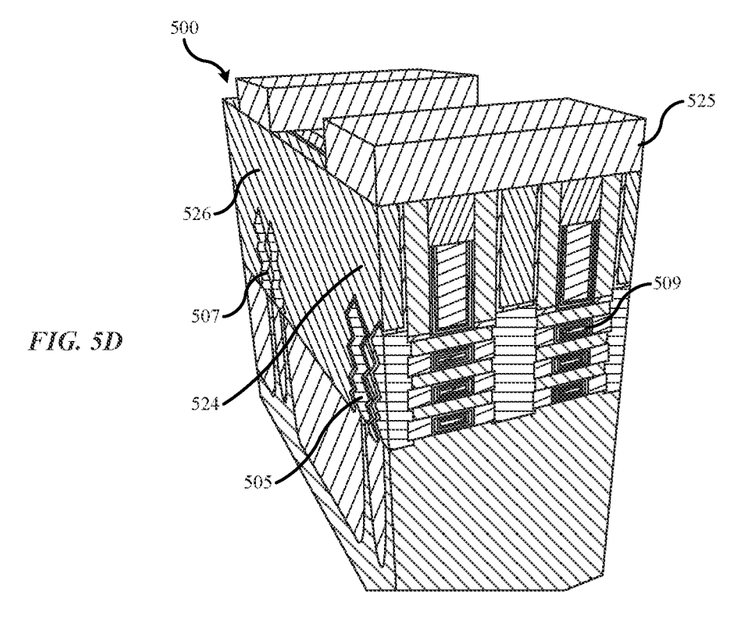
Figure 5E:
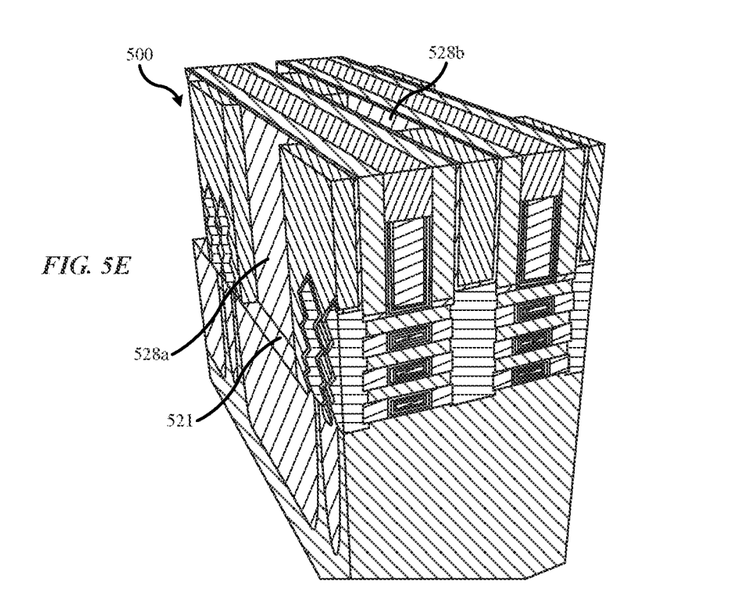

At operation 420, a mask material 525 may be formed over the source/drain regions 524, 526 of substrate 501 as illustrated in FIG. 5D. The source/drain regions may be the areas about and containing contact materials 505, 507, for example. The mask material 525 may be any material suitable for use in a transfer etching process that may by consumed during the etch. In one example, the mask material 525 may be an oxide hardmask that is patterned over the source/drain regions 524, 526 of semiconductor substrate 501. Mask material 525 may be formed across the contacts and gate materials in two regions that cover the contacts 505, 507 and nanowires 509 across the device. A transfer etch process may be performed at operation 425 to remove a portion of the gap fill material between the source/drain regions 524, 526 of substrate 501, as illustrated in FIG. 5E.

The transfer process may selectively remove a first region of the gap fill material 523 in first region 528a, which may be an interior region between source/drain regions 524, 526, while maintaining the gap fill material 523, which may be a silicon-containing material such as polysilicon, within the source/drain regions 524, 526. The gap fill material 523 may also be removed from a gap region 528b located between the gate materials and liners between the two gates illustrated. The removal may expose a portion of contact etch stop layer 521 within first region 528a of the structure 500. Operation 420 may differentiate from traditional processing by applying the mask material 525 over the source/drain regions 524, 526. In this way, transfer process 425 may be performed with less concern about critical dimensions of the contact materials. For example, were transfer operation 425 to punch through contact etch stop layer 521 and into oxide material 503, there would be no loss of critical amounts of contact material, unlike if the transfer process were also performed in source/drain regions 524, 526.

Figure 5F:
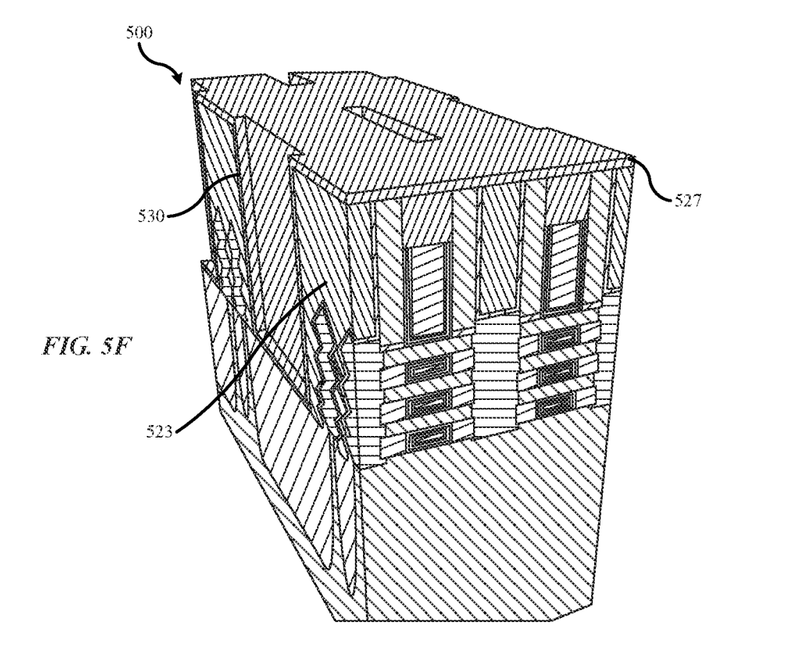

A liner material 527 may be formed across the structure 500 at operation 430, as illustrated in FIG. 5F. The liner material may cover all exposed areas, and may be formed over contact etch stop layer 521 within the first region 528a. The liner material may also cover across a depth of the remaining gap fill material 523 in the source/drain regions 524, 526, as illustrated in portion 530 of liner material 527. This portion 530 may be along or contacting second regions of the gap fill material, such as a silicon-containing material, residing in the source/drain region 524, 526. Liner 527 may be formed to protect contact etch stop layer 521 within first region 528a between the source/drain regions 524, 526. Liner 527 may be any number of materials, and in embodiments, may be silicon nitride.

Figure 5G:
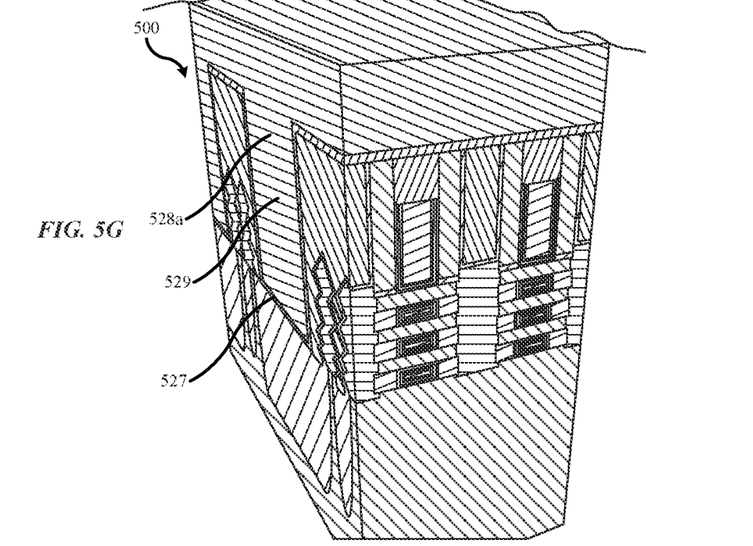

A gap fill material 529 may be formed or deposited over the structure 500 in operation 435 as illustrated in FIG. 5G.

Figure 5H:
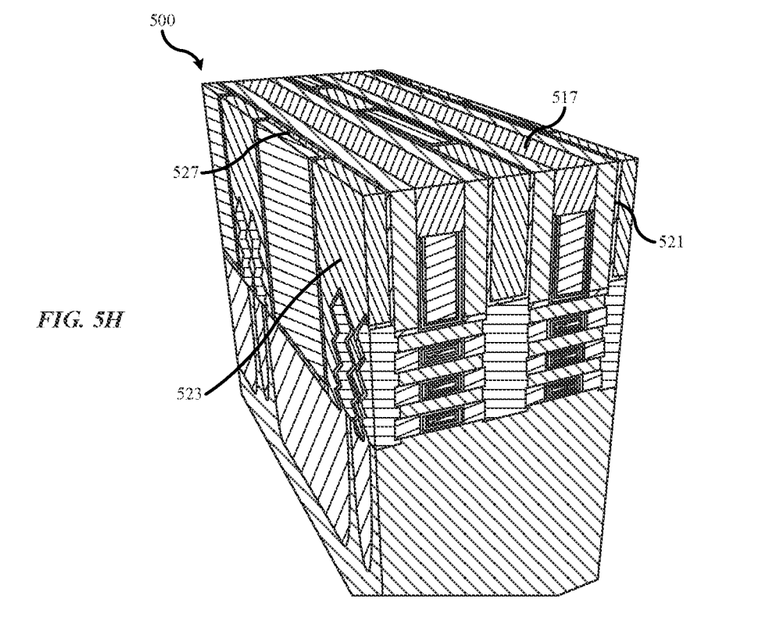

In first region 528a, the gap fill material 529 may form along the liner 527 between gates. Another chemical-mechanical polishing operation 440 may be performed to remove excess gap fill material 529 and liner material 527 overlying the cap material 517 and gap fill material 523. As illustrated in FIG. 5H, the remaining gap fill material 523, such as polysilicon, may be exposed, along with areas of contact etch stop layer 521.

Figure 5I:
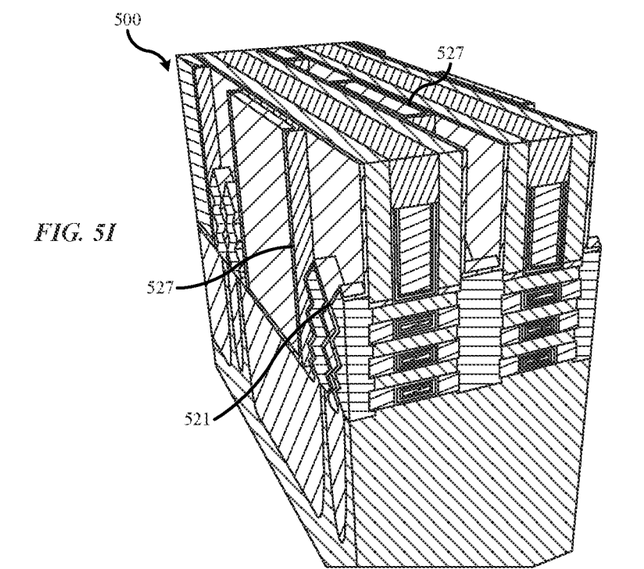

Remaining gap fill material 523 may be removed in operation 445, as illustrated in FIG. 5I. An etching operation may be performed similarly to operation 410 discussed above. The process may be performed to selectively remove second regions of the silicon material, which may be within source/drain regions 524, 526. The removal may expose a second region of contact etch stop layer 521, which may be in source/drain regions 524, 526. The process may be performed about contacts 505, 507 down to the substrate 501 level. In this way, substantially all, essentially all, or all gap fill material 523 or silicon material may be removed from the structure 500. The etch process in operation 445 may be highly selective to polysilicon relative to silicon oxide and silicon nitride, which may be or be included in the contact etch stop layer 521 and liner layer 527. For example, operation 445 may have a selectivity towards polysilicon relative to oxide or nitride greater than or about 500:1 in embodiments, and may be greater than or about 600:1, greater than or about 700:1, greater than or about 800:1, greater than or about 900:1, greater than or about 1,000:1, or more. In this way, the relatively thin contact etch stop layer 521, which may be less than 5 nm in thickness, less than 4 nm in thickness, less than 3 nm in thickness, about 1 nm to about 3 nm in thickness, or about 2 nm to about 3 nm in thickness may be maintained during operation 445, which may fully protect contact regions 505, 507 from damage or removal.

Figure 5J:
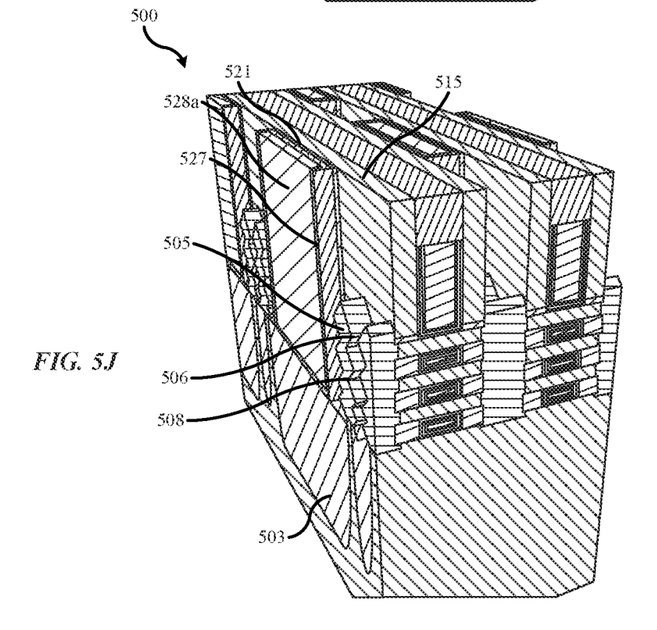

Method 400 may include selectively removing the second regions of contact etch stop layer 521, which may be in source/drain regions 524, 526 in operation 450. As illustrated in FIG. 5J, the contact etch stop layer 521, which may be silicon oxide, for example, may be selectively removed from surfaces of contacts 505, 507 as well as along sidewalls of spacer 515, and along oxide material 503 within substrate 501. Operation 450 may be performed similarly to operation 410 discussed above, and may be performed within the same chamber as operation 445. The operation may perform a selective etch to remove exposed oxide material in order to remove the contact etch stop layer 521 within source/drain regions 524, 526. The etch may be highly selective to silicon-containing materials, such as silicon, silicon nitride, SiGe, and SiP. For example, operation 450 may etch oxide relative to SiGe and SiP greater than or about 500:1, and may etch the oxide greater than or about 600:1, greater than or about 700:1, greater than or about 800:1, greater than or about 900:1, greater than or about 1,000:1, or more. The process may also etch silicon oxide relative to silicon nitride greater than or about 50:1. Because the contact etch stop layer 521 may be only a few nanometers in thickness, these selectivities may fully protect the critical dimensions of the other structures including contacts 505, 507. This may allow the contact etch stop layer 521 to be removed from all surfaces of the contacts 505, 507 in embodiments, while being maintained behind liner 527 in embodiments. Liner 527 may also be maintained along the depth profile of the first region 528a.

Traditional operations often stop etching through material once the etch stop layer has been reached, and do not etch between and around the contacts, because many traditional operations utilize a silicon nitride liner. With respect to the contact materials, the processes may only have a selectivity of about 10:1. Although this may allow the top of the contacts to be exposed, etching down within the contacts may expose the top of the contacts to additional etchants, which may etch the contacts as the process is continued. However, with the oxide contact etch stop layer of the present technology, and the selectivities that may exceed 1,000:1 with respect to the contact materials, all surfaces of the contact may be exposed, producing a wrap-around contact. Additionally, profiles and amounts of contact materials may be adjusted based on the present technology, which may improve conductivity or reduce resistance due to the residual etch stop layer material of traditional processes.

The selectivities may also allow the contact etch stop layer 521 to be maintained in first region 528a as illustrated. Liner 527 may prevent or reduce exposure of the contact etch stop layer 521 in first region 528a from being removed in operation 450. Although exposed side and top portions may experience a certain amount of etching, this section may be substantially maintained during operation 450. Moreover, the chemical-mechanical polishing operation 440 may be performed to allow a budget of an additional amount of contact etch stop layer 521 on a top surface of structure 500 to account for the minimal removal during operation 440. By using plasma enhanced etching operations for each of the selective removal operations, the removal operations of method 400 may be performed without reactive-ion etching or wet etching in embodiments of the present technology.

As illustrated in FIG. 5J, contacts 505, 507 may include more complex geometries because of the selectivities of the present technology. For example, contacts 505, 507 may include a sawtooth external profile, a triangular external profile, or a diamond external profile, among many other variations that would be understood to be encompassed by the present technology. The profile may also include multiple sections of contact 505, 507, such as illustrated. The contacts may include at least about 1, at least about 2, at least about 3, at least about 4, at least about 5, or more sections, such as vertical sections, exhibiting the profile. The selective removal of contact etch stop layer 521 may remove the oxide material from all exposed surfaces of the contacts 505, 507 in embodiments vertically down to the substrate level regardless of the profile geometry, while maintaining substantially or essentially all of the contact material.

A top portion of each contact 505, 507, which may be exposed longer than other portions, may be etched vertically less than or about 2 nm in embodiments, and may be etched vertically less than or about 1 nm, less than or about 0.5 nm, less than or about 0.3 nm, less than or about 0.2 nm, less than or about 0.1 nm, or may be essentially maintained during the removal of the contact etch stop layer. The contacts 505, 507 may also be characterized by a vertical profile having a first exterior thickness 506 and a second exterior thickness 508 less than the first exterior thickness. As illustrated in FIG. 5J, a region having the second exterior thickness may be located below a region characterized by the first exterior thickness.

Figure 5K:
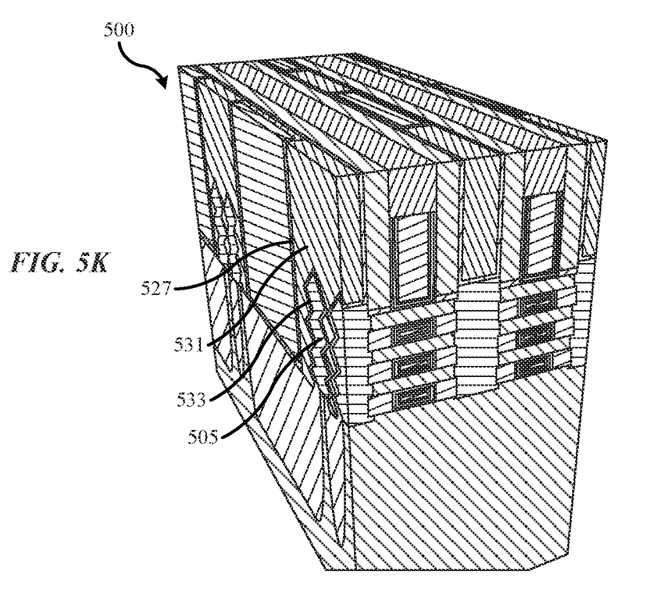

Subsequent removal of the contact etch stop layer from the source/drain regions and about the contacts, various processes may be performed to deposit or form a metal 531 within the source/drain regions 524, 526 in operation 455, which may also be contact regions including contacts 505, 507 as illustrated in FIG. 5K. Operations including silicidation and deposition or formation of a barrier 533 may also be performed prior to forming the metal material. The metal 531 may be any number of metals including tungsten, cobalt, or other metals suitable for semiconductor structures. Liner layer 527 may be maintained and may contact the metal material along a depth of the metal 531 within structure 500. Metal 531 may provide wrap-around contacts as the formation or deposition may allow the metal 531 to be formed down to the oxide material 503 within substrate 501. Metal 531 may then be proximate or contact all exposed surfaces of contacts 505, 507, depending on formation of the barrier layer. For example, a barrier 533 may be formed about each exposed surface of contacts 505, 507 down to the substrate, and then metal 531 may be formed about the barrier layer along each surface of contacts 505, 507, so it is positioned proximate each surface of the contact. Accordingly, contacts characterized by a diamond or other pattern as previously described, and exposed using processes of the present technology, may allow metal 531 to be formed or deposited about each angled section of the contacts including the bottom surface of each section of contact. Such a structure may allow improved conductivity and performance of the produced device.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor structure, the semiconductor structure comprising:
two contact regions proximate a gate and separated by an interior region proximate the gate, wherein a metal material is formed about contacts in the two contact regions, wherein the interior region comprises a liner material, the interior region comprises an oxide layer between the liner material and a spacer layer, and the spacer layer is between the oxide layer and the gate, and wherein the contacts comprise multiple sections of a sawtooth profile along both vertical sides of the contacts such that the metal material fills the multiple sections of the sawtooth profile around the contacts.

2. The semiconductor structure of claim 1, wherein one of the two contact regions includes a p-contact material, and wherein a second of the two contact regions includes an n-contact material.

3. The semiconductor structure of claim 1, wherein the contacts are characterized by a vertical profile having a first exterior thickness and a second exterior thickness less than the first exterior thickness, wherein a region characterized by the second exterior thickness is located below a region characterized by the first exterior thickness.

4. The semiconductor structure of claim 1, wherein the semiconductor structure comprises two contacts including a silicon-containing material.

5. The semiconductor structure of claim 4, wherein a first contact of the contacts comprises SiGe, and wherein a second contact of the contacts comprises SiP.

6. The semiconductor structure of claim 1, wherein the spacer layer is between the metal material and the gate.

7. The semiconductor structure of claim 1, wherein the oxide layer and the liner material end at the metal material.

8. A semiconductor structure, the semiconductor structure comprising:
two contact regions proximate a gate and separated by an interior region proximate the gate, wherein a metal material is formed about contacts in the two contact regions, the contacts comprise multiple sections of a sawtooth profile along both vertical sides of the contacts such that the metal material fills the multiple sections of the sawtooth profile around the contacts, and the interior region comprises a liner material and an oxide contact etch stop layer between the two contact regions.

9. The semiconductor structure of claim 8, wherein the oxide contact etch stop layer extends down to a substrate.

10. The semiconductor structure of claim 8, wherein the oxide contact etch stop layer extends underneath the liner material.

11. The semiconductor structure of claim 8, wherein the oxide contact etch stop layer ends at the metal material.

12. The semiconductor structure of claim 8, wherein the oxide contact etch stop layer is proximate a spacer layer that is proximate the gate.

13. The semiconductor structure of claim 8, wherein the oxide contact etch stop layer wraps around sides of the interior region.

14. The semiconductor structure of claim 8, wherein the oxide contact etch stop layer comprises an atomic layer deposition oxide.

15. The semiconductor structure of claim 8, wherein the oxide contact etch stop layer does not extend between the two contacts regions and the gate.

16. A semiconductor structure, the semiconductor structure comprising:
two contact regions proximate a gate and separated by an interior region proximate the gate, wherein a metal material is formed around contacts in the two contact regions down to a substrate, wherein the interior region comprises a liner material and an oxide layer between the two contact regions, and wherein the contacts comprise multiple sections of a sawtooth profile along both vertical sides of the contacts such that the metal material fills the multiple sections of the sawtooth profile around the contacts.

17. The semiconductor structure of claim 16, wherein each of the contacts comprises at least three sawtooth features on each of the vertical sides of the contacts.

18. The semiconductor structure of claim 16, wherein the contacts comprise a vertical profile having a first exterior thickness and a second exterior thickness less than the first exterior thickness, and the metal material fills an area around the first exterior thickness and the second exterior thickness.

19. The semiconductor structure of claim 16, wherein the oxide layer comprises an oxide contact etch stop layer.

20. The semiconductor structure of claim 16, wherein the oxide layer is between the liner material and a spacer layer, and the spacer layer is between the oxide layer and the gate.

* * * * *